US012720864B2

(12) United States Patent
Liu et al.

(10) Patent No.: US 12,720,864 B2
(45) Date of Patent: Aug. 25, 2026

(54) DISPLAY PANEL AND DISPLAY APPARATUS

(71) Applicants: BOE MLED Technology Co., Ltd., Beijing (CN); BOE Technology Group Co., Ltd., Beijing (CN)

(72) Inventors: Chao Liu, Beijing (CN); Zhonglan Zhao, Beijing (CN); Ming Zhai, Beijing (CN); Haiwei Sun, Beijing (CN); Lingyun Shi, Beijing (CN); Qibing Gu, Beijing (CN); Lili Wang, Beijing (CN); Mingming Jia, Beijing (CN); Sha Feng, Beijing (CN); Jing Wang, Beijing (CN)

(73) Assignees: BOE MLED Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 631 days.

(21) Appl. No.: 18/016,478

(22) PCT Filed: Jan. 29, 2022

(86) PCT No.: PCT/CN2022/074923

§ 371 (c)(1),
(2) Date: Jan. 17, 2023

(87) PCT Pub. No.: WO2023/142021

PCT Pub. Date: Aug. 3, 2023

(65) Prior Publication Data

US 2024/0258325 A1 Aug. 1, 2024

(51) Int. Cl.

*H10D 86/60* (2025.01)
*H10D 86/40* (2025.01)
*H10W 90/00* (2026.01)

(52) U.S. Cl.

CPC .......... *H10D 86/60* (2025.01); *H10D 86/441* (2025.01); *H10W 90/00* (2026.01)

(58) Field of Classification Search

CPC .................................................. G02F 1/13452
See application file for complete search history.

(56) References Cited

U.S. PATENT DOCUMENTS 5,592,199 A * 1/1997 Kawaguchi ......... H01L 23/4985 345/206
7,492,433 B2 * 2/2009 Imajo .................. G02F 1/13452 349/149

(Continued)

FOREIGN PATENT DOCUMENTS

CN 104698710 A 6/2015
CN 107664886 A * 2/2018 ............... H05F 3/02

(Continued)

*Primary Examiner* — Fatima N Farokhrooz
(74) *Attorney, Agent, or Firm* — Nath, Goldberg & Meyer; Joshua B. Goldberg

(57) ABSTRACT

A display panel and a display apparatus are provided. The display panel includes: a base substrate having a first face, a second face, and a side face, the first face including a display region and a peripheral region; multiple first bonding electrodes in the peripheral region each being electrically connected to a display signal line on the first face and extending from the display region to the peripheral region; multiple driving signal lines on the second face of the base substrate, wherein at least one driving signal line is a ground line; multiple side wires each electrically connecting one driving signal line to one first bonding electrode via the side face; and an electrostatic protection layer electrically connected to the ground line and having an orthographic projection on the side face that is at least partially overlapped with orthographic projections of the side wires on the side face.

13 Claims, 12 Drawing Sheets

(56) References Cited

U.S. PATENT DOCUMENTS

| | | | | |
|---|---|---|---|---|
| 9,606,678 | B2 * | 3/2017 | Ishizaki | G06F 3/0412 |
| 9,894,781 | B2 * | 2/2018 | Franklin | G06F 1/1633 |
| 2010/0156857 | A1 | 6/2010 | Nozaki | |
| 2020/0196496 | A1 * | 6/2020 | Shin | G06F 1/16 |
| 2020/0235189 | A1 * | 7/2020 | Bae | H05K 1/118 |
| 2021/0066674 | A1 | 3/2021 | Kang et al. | |

FOREIGN PATENT DOCUMENTS

| | | | | | |
|---|---|---|---|---|---|
| CN | 110346957 | A | * | 10/2019 | G02F 1/13452 |
| CN | 111668275 | A | | 9/2020 | |
| CN | 212256800 | U | | 12/2020 | |
| CN | 112599535 | A | | 4/2021 | |
| CN | 113342203 | A | | 9/2021 | |
| CN | 113552746 | A | | 10/2021 | |
| CN | 113920895 | A | | 1/2022 | |
| CN | 113994414 | A | | 1/2022 | |

* cited by examiner 4
4a
71
71a
51
d2
d1
62
First direction

DISPLAY PANEL AND DISPLAY APPARATUS

This is a National Phase Application filed under 35 U.S.C. 371 as a national stage of PCT/CN2022/074923, filed Jan. 29, 2022, the content of which is hereby incorporated by reference in its entirety.

TECHNICAL FIELD

The present disclosure relates to the field of display technology, and specifically relates to a display panel and a display apparatus.

BACKGROUND

Electrostatic breakdown is a phenomenon that because of a large amount of static electricity accumulated during manufacturing of a display panel, an instantaneous current in a relatively thin wire or at a lead intersection in the charge transfer process is so high that an electronic device is damaged. In the manufacturing or testing of the display panel, the yield of the display panel will be affected once electrostatic breakdown occurs.

SUMMARY

Embodiments of the present disclosure provide a display panel and a display apparatus.

In a first aspect, the present disclosure provides a display panel, including:

a base substrate, wherein the base substrate has a first face and a second face opposite to each other, and a side face connecting the first face and the second face, and the first face includes a display region and a peripheral region;

a plurality of first bonding electrodes in the peripheral region, wherein each of the plurality of first bonding is electrically connected to a display signal line on the first face and extending from the display region to the peripheral region;

a plurality of driving signal lines on the second face of the base substrate, wherein at least one of the plurality of driving signal lines is a ground line;

a plurality of side wires, each of which electrically connects one of the plurality of driving signal lines to one of the plurality of first bonding electrodes via the side face; and an electrostatic protection layer electrically connected to the ground line, wherein an orthographic projection of the electrostatic protection layer on the side face is at least partially overlapped with orthographic projections of the plurality of side wires on the side face.

In some embodiments, the electrostatic protection layer includes at least:

a first electrostatic protection part and a second electrostatic protection part connected to each other, the first electrostatic protection part is located on the second face of the base substrate, and an orthographic projection of the first electrostatic protection part on the second face covers an orthographic projection on the second face of a part of each side wire on the second face; the first electrostatic protection part is connected to the ground line; and an orthographic projection of the second electrostatic protection part on the side face covers the orthographic projection of each side wire on the side face.

In some embodiments, the display panel further includes:

a first insulation layer on a side of the plurality of driving signal lines away from the base substrate, wherein each side wire is connected to one of the plurality of driving signal lines through a first via hole in the first insulation layer; and the first electrostatic protection part is located on a side of the first insulation layer away from the base substrate, and is connected to the ground line through a second via hole in the first insulation layer.

In some embodiments, a closest distance between an orthographic projection of a boundary of the first electrostatic protection part away from the second electrostatic protection part on the base substrate and an orthographic projection of the second via hole on the base substrate is between 15 μm and 25 μm.

In some embodiments, the display panel further includes:

a second insulation layer on a side of the electrostatic protection layer close to the plurality of side wires;

wherein the second insulation layer includes: a first insulation part and a second insulation part, the first insulation part is located between the first electrostatic protection part and the plurality of side wires, the second insulation part is located between the second electrostatic protection part and the plurality of side wires, and an orthographic projection of the first insulation part on the base substrate is not overlapped with an orthographic projection of the second via hole on the base substrate.

In some embodiments, the first insulation part has a first side edge away from the second insulation part and extending in a first direction, wherein the first direction intersects with a direction from the display region to the peripheral region; and the part of each side wire on the second face has a first end close to the first side edge, and a distance between an orthographic projection of the first side edge on the base substrate and an orthographic projection of the first end on the base substrate is between 15 μm to 25 μm.

In some embodiments, the second insulation layer further includes:

a third insulation part on a side, away from the second face, of the part of each side wire on the second face and connected to the second insulation part;

the third insulation part has a second side edge away from the side face of the base substrate and extending in a first direction, wherein the first direction intersects with a direction from the display region to the peripheral region; and a part of each side wire on the first face has a second end close to the second side edge, and a distance between the second side edge and the second end is between 15 μm to 25 μm.

In some embodiments, the electrostatic protection layer further includes:

a third electrostatic protection part on the first face of the base substrate, in the peripheral region, and connected to the second electrostatic protection part.

In some embodiments, the first electrostatic protection part, the second electrostatic protection part, and the third electrostatic protection part are connected into a single-piece structure, an orthographic projection of the third electrostatic protection part on the first face traverses the first face in a first direction, and an orthographic projection of the first electrostatic protection part on the second face traverses the second face in the first direction, wherein the first direction intersects with a direction from the display region to the peripheral region.

In some embodiments, the display panel further includes:

a third insulation layer at least partially located on a side of the second electrostatic protection part away from the side face of the base substrate.

In some embodiments, the third insulation layer covers the entire second electrostatic protection part and at least a part of the first electrostatic protection part.

In some embodiments, the display region includes a plurality of sub-pixels, each of which is provided with a light-emitting element connected to the display signal line.

In some embodiments, the display panel further includes:

a driving structure connected to the plurality of driving signal lines and configured to provide driving signals to the plurality of driving signal lines.

In some embodiments, the display panel further includes:

a first insulation layer on a side of the plurality of driving signal lines away from the base substrate, wherein each side wire is connected to a corresponding driving signal line through a first via hole in the first insulation layer; and wherein the driving structure is connected to the plurality of driving signal lines through third via holes in the first insulation layer.

In a second aspect, the present disclosure provides a display apparatus, including:

the display panel according to the first aspect;

an outer frame at least partially located on a side of the base substrate away from the display signal line; and a bonding adhesive on the side of the base substrate away from the display signal line and between the display panel and the outer frame.

In some embodiments, the outer frame is a metal frame; and the bonding adhesive is a conductive adhesive between the metal frame and the electrostatic protection layer.

BRIEF DESCRIPTION OF DRAWINGS

The accompanying drawings, which are used to provide further understanding of the present disclosure and constitute a part of the specification, are used to explain the present disclosure together with the following specific implementations, but not to limit the present disclosure. In the accompanying drawings: s.

DETAIL DESCRIPTION OF EMBODIMENTS

Hereinafter, specific implementations of the present disclosure will be described in detail in conjunction with the accompanying drawings. It will be appreciated that the specific implementations as set forth herein are merely for the purpose of illustration and explanation of the present disclosure and should not be constructed as a limitation thereof.

To make the objects, technical solutions and advantages of the embodiments of the present disclosure more apparent, the technical solutions according to the embodiments of the present disclosure will be clearly and completely described below with reference to the drawings of the embodiments of the present disclosure. Apparently, the described embodiments are only a part, but not all, of the embodiments of the present disclosure. All other embodiments obtained by those of ordinary skill in the art based on the embodiments of the present disclosure described herein without creative effort shall fall within the protection scope of the present disclosure.

Unless otherwise defined, technical or scientific terms used in the embodiments of the present disclosure are intended to have general meanings as understood by those of ordinary skill in the art. The words "first", "second" and similar terms used in the present disclosure do not denote any order, quantity, or importance, but are used merely for distinguishing different components from each other. Likewise, the word "comprising" or "including" or the like means that an element or item preceding the word covers an element or item listed after the word or equivalents thereof, but does not exclude other elements or items. The terms "connect" or "couple" and the like are not restricted to physical or mechanical connection, but may include electrical connection, whether direct or indirect. The words "upper", "lower", "left", "right", and the like are merely used to indicate a relative positional relationship, and when an absolute position of the described object is changed, the relative positional relationship may also be changed accordingly.

Figure 1:
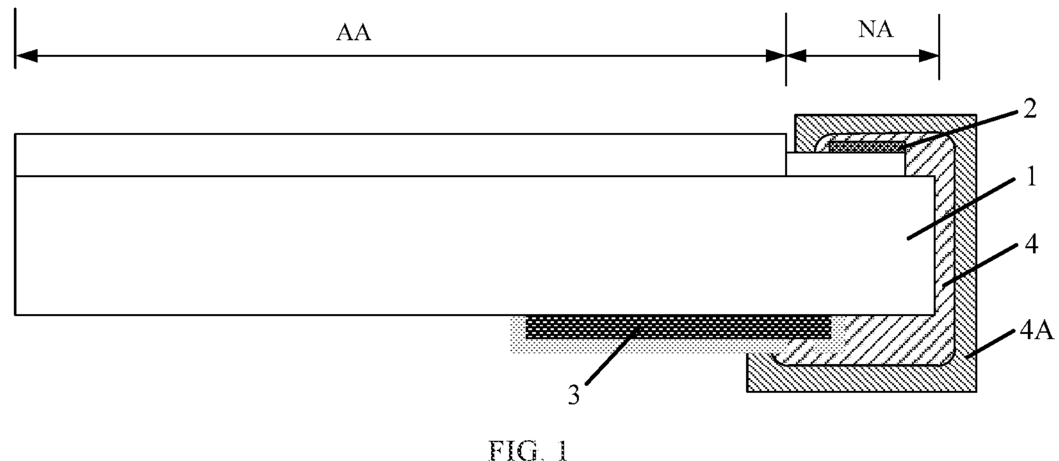
FIG. 1 is a schematic diagram of a side wiring technology according to an example.

At present, the micro light-emitting diode (Micro LED or Mini LED) display technology is being developed rapidly, and due to its outstanding advantages such as miniature volume, low power consumption, high color saturation, rapid reaction, long service life, and the like, many scientific and technological workers are attracted into research of this technology. However, since mass transfer technology is still not mature, the development of high resolution and large-size micro light-emitting diode displays is hindered. For television and giant screen display corresponding to the capacity of the existing mass transfer technology, the defect of the existing mass transfer technology can be compensated for by seamless splicing display technology to implement large-screen display. To implement real seamless splicing in a micro light-emitting diode splicing display screen, side wiring is required. FIG. 1 is a schematic diagram of a side wiring technology according to an example. As shown in FIG. 1, at least one display signal line extends from a display region AA on the front to a peripheral region NA, and is connected to a first bonding electrode 2 which is in the peripheral region NA. The first bonding electrode 2 is connected to a side wire 4. The side wire 4 extends to a back face of the base substrate 1 via a side face of a base substrate 1, and is connected to a driving signal line 3 which is on the back face and connected to a driver chip by IC bonding or the like.

As shown in FIG. 1, when a large-size splicing display screen is formed through seamless splicing display technology, to prevent the side wire of the display panel from interfering with an adjacent display panel, an insulation protective layer 4A is disposed on an outer layer of the side wire 4 to separate adjacent display panels, thereby avoiding affecting the display effect of the splicing display screen. To meet the requirement of seamless splicing of the splicing display screen, a thin (e.g., 2 μm to 10 μm in thickness) insulation protective layer 4A is generally provided. In this way, however, when static electricity is generated at an edge position of the display panel in the manufacturing or testing of the display panel, the insulation protective layer 4A cannot have a good electrostatic protection effect. In this case, a side of the electrostatic protection layer 4A away from the side face of the base substrate 1 needs to be connected to a metal conductive layer by a conductive adhesive or by dispensing a silver adhesive to discharge the static electricity. However, since the conductive adhesive or the dispensed silver adhesive has a large thickness, a bezel width of the display panel may be affected if the adhesive is provided on the side face of the display panel, which is adverse to a narrow bezel design of the display panel, and may further influence the display effect of the splicing screen.

In order to solve the above technical problems, an embodiment of the present disclosure provides a display panel which meets the requirement of the display panel on a narrow bezel while effectively implementing electrostatic protection.

Figure 2:
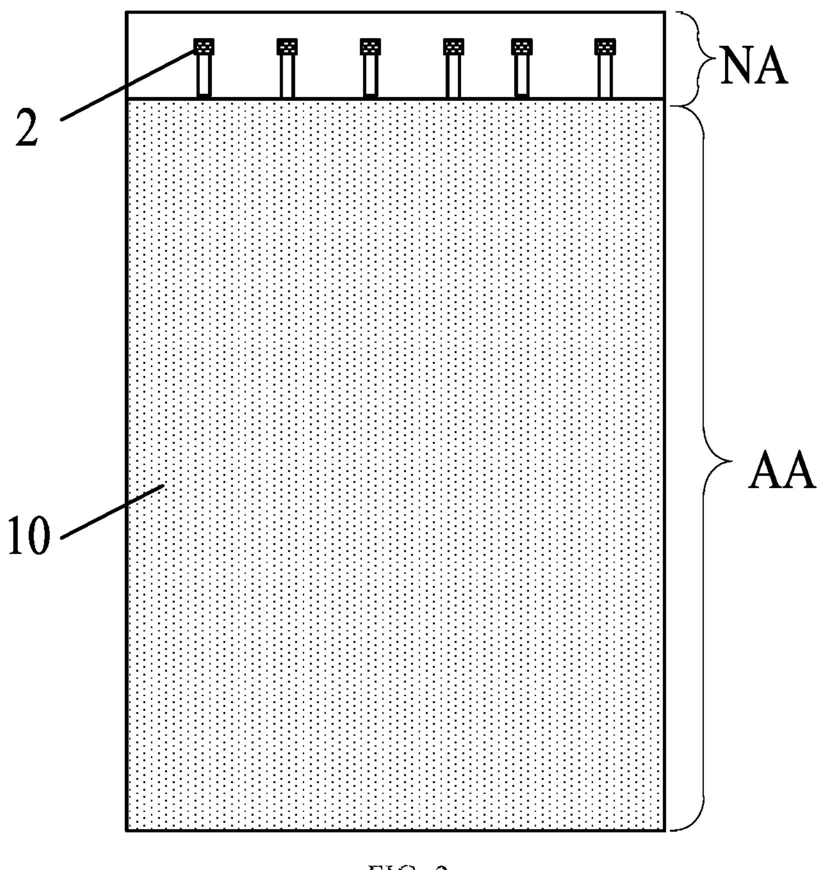
FIG. 2 is a plan view of a display structure layer and first bonding electrodes on a display panel according to an embodiment of the present disclosure.
Figure 3:
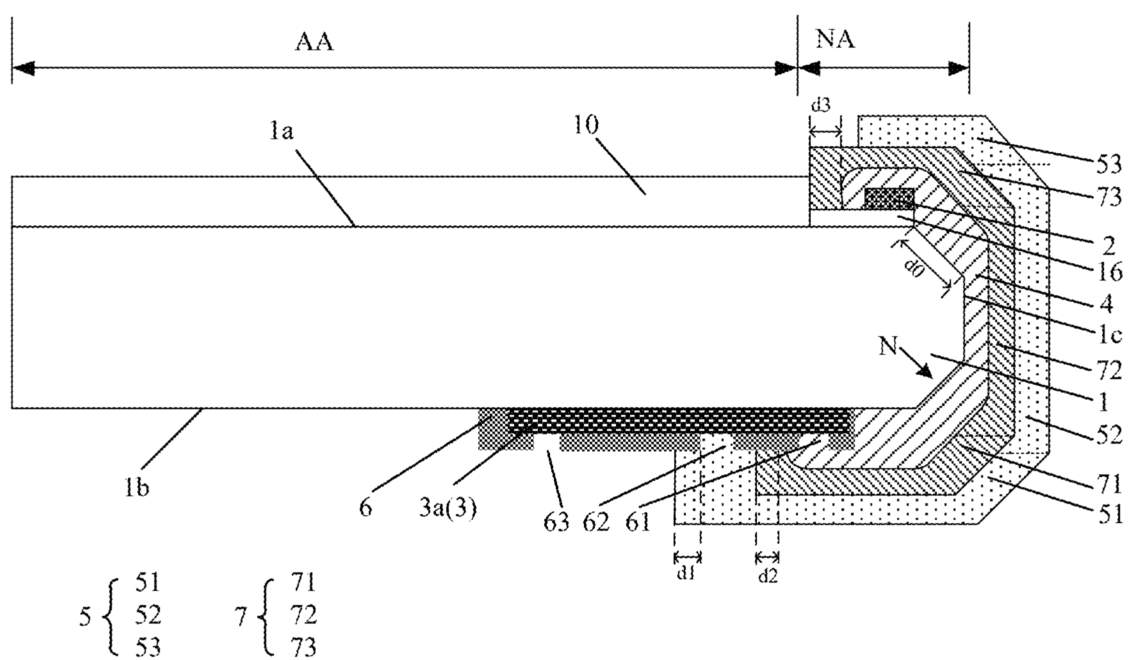
FIG. 3 is a schematic structural diagram of a display panel according to an embodiment of the present disclosure.

FIG. 2 is a plan view of a display structure layer and first bonding electrodes on a display panel according to an embodiment of the present disclosure, and FIG. 3 is a schematic structural diagram of a display panel according to an embodiment of the present disclosure. As shown in FIGS. 2 and 3, an embodiment of the present disclosure provides a display panel including: a base substrate 1, a plurality of first bonding electrodes 2, a display structure layer 10, a plurality of side wires 4 and an electrostatic protection layer 5. The base substrate 1 has a first face 1*a* and a second face 1*b* opposite to each other, and a side face 1*c* connecting the first face and the second face. The first face includes a display region AA and a peripheral region NA. The peripheral region NA is located on at least one side of the display region AA, and the display region AA includes a plurality of sub-pixels. The display structure layer 10 includes a plurality of display signal lines 16 and a plurality of light-emitting elements. Each sub-pixel is provided with a light-emitting element, and the light-emitting element is, for example, a micro light-emitting diode such as a Micro LED or a Mini LED or the like. The plurality of display signal lines 16 are configured to provide driving signals for the plurality of light-emitting elements, and at least a part of the display signal lines 16 extend from the display region to the peripheral region NA.

The plurality of first bonding electrodes 2 are located in the peripheral region NA, and each first bonding electrode 2 is electrically connected to a display signal line 16 extending from the display region AA to the peripheral region NA. In an exemplary embodiment, each first bonding electrode 2 may have a rectangular shape, and may have a length between 0.08 mm and 0.2 mm and a width between 0.06 mm and 0.1 mm.

Figure 4:
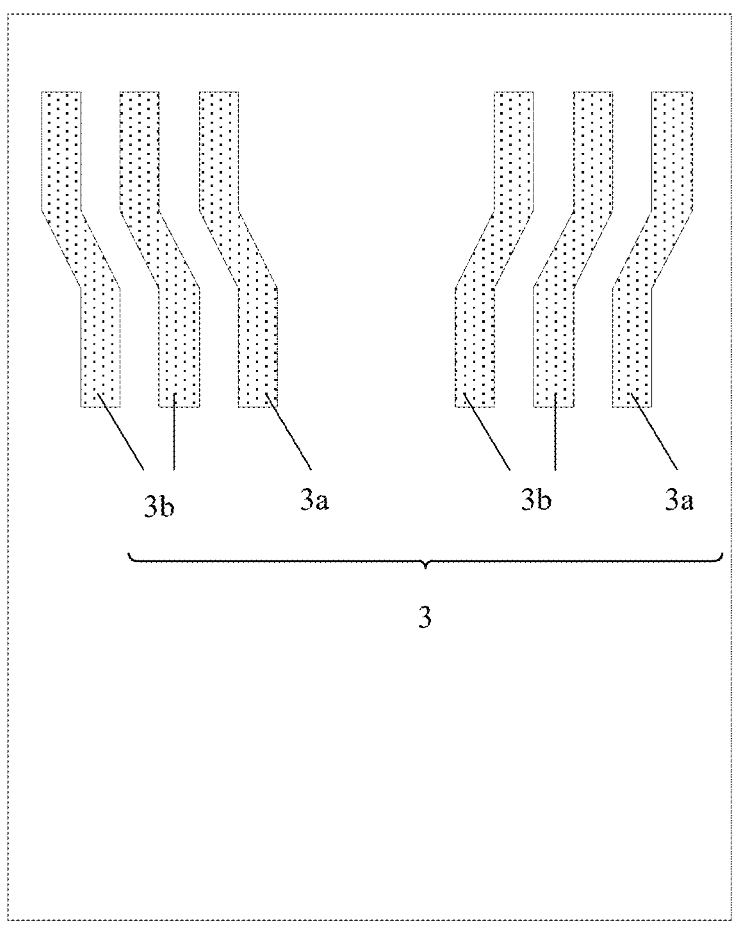
FIG. 4 is a plan view of driving signal lines according to an embodiment of the present disclosure.

FIG. 4 is a plan view of driving signal lines according to an embodiment of the present disclosure. As shown in FIG. 4, a plurality of driving signal lines 3 are disposed on the second face 1*b*, and at least one of the plurality of driving signal lines 3 is a ground line. Each side wire 4 electrically connects one driving signal line 3 to one first bonding electrode 2 via the side face. An end of the driving signal line 3 away from the side wire may be connected to a driving structure 9 (e.g., a driving circuit board), so as to receive a driving signal from the driving structure 9, and the side wire 4 transmits the driving signal on the driving signal line 3 to the display signal line 16, and thus to one of the light-emitting elements.

The electrostatic protection layer 5 is electrically connected to the ground line 3*a*, and an orthographic projection of the electrostatic protection layer 5 on the side face 1*c* covers orthographic projections of the side wires 4 on the side face 1*c*. The material of the electrostatic protection layer is not limited in the embodiments of the present disclosure. For example, the electrostatic protection layer 5 may be made of an anti-corrosion metal material, such as Ti. The side wires 4 on the display panel may be formed through a sputtering process.

It should be noted that in FIG. 3, a chamfer N is formed at an edge position of an intersection of the first face 1*a* and the side face 1*c* of the base substrate 1, and a chamfer is also formed at an edge position of an intersection of the second face 1*b* and the side face 1*c*. The formation of the chamfers is beneficial to preventing the side wires 4 from being broken at the edge position when preparing the side wires 4 on the display panel through a sputtering process, and avoiding fracture at the edge position when depositing other film layers on the base substrate. The chamfer N may have a width of d0. For example, d0 is 1/30 to 1/5 of a thickness of the base substrate, which is not specifically limited. In an embodiment, the chamfer N may be a bevel cut or an outwardly protruded arc structure.

In the schematic structural diagrams of other display panels provided in the embodiments of the present disclosure, although the base substrate is illustrated to have a right-angle structure at the edge position, the edge position may also be made into a chamfer structure as shown in FIG. 3, which is not limited in the present disclosure.

In an embodiment, the fact that at least one of the plurality of driving signal lines 3 is a ground line 3*a* specifically refers to that: some of the plurality of driving signal lines 3 are ground lines 3*a*, while the others are not ground lines (hereinafter referred to as non-ground lines 3*b*). As shown in FIG. 4, the electrostatic protection layer 5 is spaced apart from the non-ground lines 3*b* by an insulation layer, so as to prevent different driving signal lines 3 from being short-circuited through the electrostatic protection layer 5. The driving signal lines in the embodiments of the present disclosure are made of a metal material, which may be a single-layer metal, or a stack of multiple layers of metals, such as Ti/AL/Ti, Mo/Cu/Mo, Ti/Cu/Ti, Mo/Cw/ITO, or the like, which is not limited in the embodiments of the present disclosure. The plurality of driving signal lines 3 may be formed by depositing a metal layer on the second face 1*b* of the base substrate 1 and patterning the metal layer.

The display panel according to the embodiments of the present disclosure is provided with an electrostatic protection layer 5, and an orthographic projection of the electrostatic protection layer 5 on the side face 1*c* covers orthographic projections of the side wires 4 on the side face 1*c*. Since the electrostatic protection layer 5 is connected to the ground line 3*a*, static electricity generated on the side face of the display panel can be led out through the electrostatic protection layer in the electrostatic test process, thereby improving the electrostatic protection capability of the display panel. On the other hand, since the electrostatic protection layer 5 can have a function of electrostatic prevention, an excessively thick structure such as an insulation layer or a conductive is no longer needed on the side face of the display panel, thereby facilitating implementation of a narrow bezel of the display panel.

In some embodiments, the electrostatic protection layer 5 may have a thickness between 0.06 μm and 0.5 μm, so that the influence of the electrostatic protection layer 5 on the bezel width of the display panel is reduced, while a good electrostatic prevention effect is achieved.

As shown in FIG. 3, in some embodiments, the electrostatic protection layer 5 includes at least: a first electrostatic protection part 51 and a second electrostatic protection part 52 connected to each other. The first electrostatic protection part 51 is located on the second face 1*b* of the base substrate, and an orthographic projection of the first electrostatic protection part 51 on the second face 1*b* covers an orthographic projection on the second face 1*b* of a part of each side edge wire 4 on the second face 1*b*. The first electrostatic protection part 51 is connected to the ground line 3*a*. The second electrostatic protection part 52 is opposite to the side face 1*c* of the base substrate 1, and an orthographic projection of the second electrostatic protection part 52 on the side face 1*c* is at least partially overlapped with an orthographic projection of each side wire 4 on the side face 1*c*. In an exemplary embodiment, the orthographic projection of the second electrostatic protection part 52 on the side face 1*c* may cover the orthographic projection of each side wire 4 on the side face 1*c*; and in another exemplary embodiment, the orthographic projection of the second electrostatic protection part 52 on the side face 1*c* may cover the entire side face 1*c*.

Figure 5:
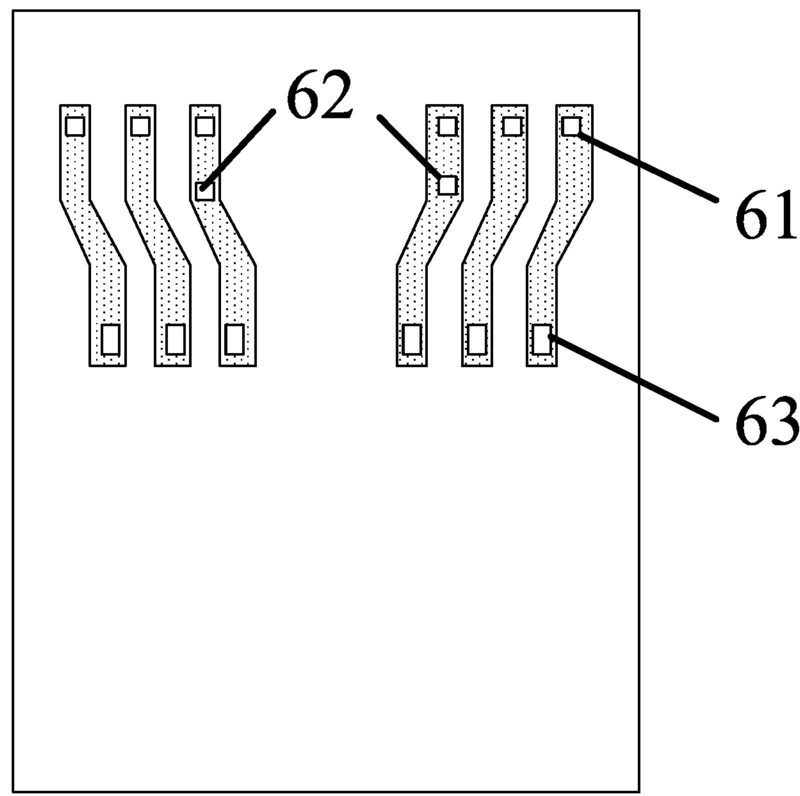
FIG. 5 is a plan view of via holes in a first insulation layer and driving signal lines according to an embodiment of the present disclosure.

As shown in FIG. 3, in some embodiments, the display panel further includes: a first insulation layer 6 having a plurality of via holes. FIG. 5 is a plan view of via holes in a first insulation layer and driving signal lines according to an embodiment of the present disclosure. As shown in FIGS. 3 and 5, the first insulation layer 6 is located on a side of the plurality of driving signal lines 3 away from the base substrate 1, and the first insulation layer 6 may cover a part of or the entire second face 1*b*. The first insulation layer 6 is provided with a plurality of first via holes 61, and each side wire 4 is connected to one of the driving signal lines 3 through a first via hole 61 in the first insulation layer 6. The first electrostatic protection part 51 is located on a side of the first insulation layer 6 away from the base substrate 1, and is connected to the ground lines 3*a* through second via holes 62 in the first insulation layer 6.

It should be noted that the embodiment of the present disclosure is illustrated by taking the case where the side wire is directly connected to the driving signal line 3 through the first via hole 61 as an example, but in other embodiments, a transfer electrode having a part in the first via hole 61 may be provided, and the side wire 4 is connected to the driving signal line 3 through the transfer electrode.

In addition, at a position corresponding to each driving signal line, the first insulation layer 6 is provided with a third via hole 63 configured to connect the driving structure to the driving signal line. The driving structure will be explained later, and is not described in detail here.

The first insulation layer may be made of any one of silicon nitride, silicon oxide, or silicon oxynitride, and each via hole may be formed through a photolithography patterning process.

In some embodiments, as shown in FIG. 3, the electrostatic protection layer 5 may further include: a third electrostatic protection part 53 connected to the second electrostatic protection part 52. The third electrostatic protection part 53 is located on the first face 1*a* of the base substrate 1 and in the peripheral region NA. In other words, the third electrostatic protection part 53 does not extend to the display region AA, so that the display function of the display panel is not affected by the provision of the third electrostatic protection part 53.

Figure 6:
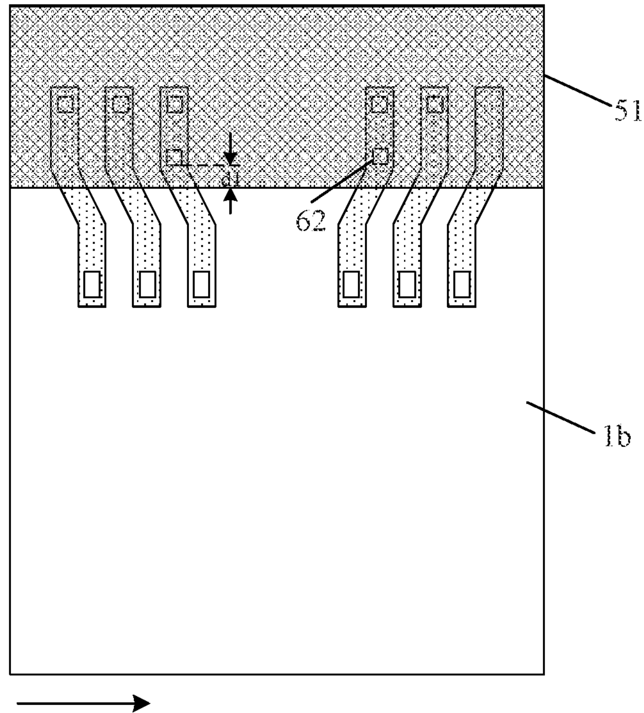
FIG. 6 is a plan view of a first electrostatic protection part and driving signal lines according to an embodiment of the present disclosure.
Figures 7, 8:
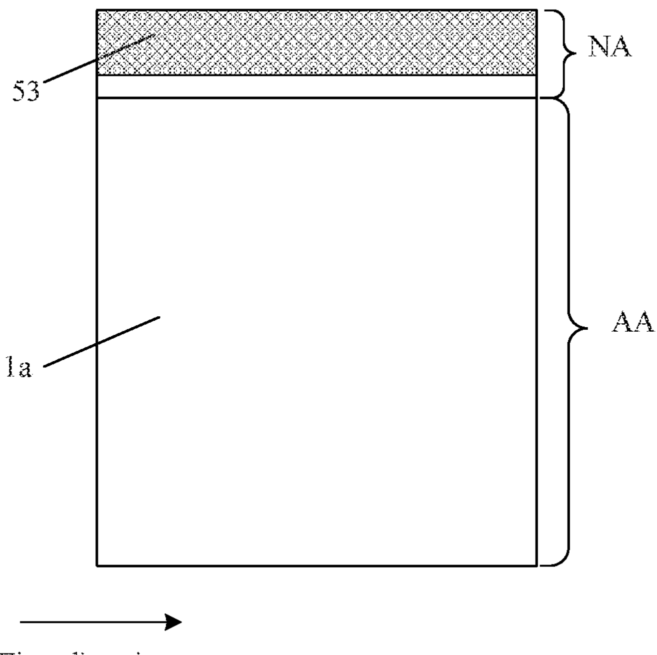
FIG. 7 is a plan view of a third electrostatic protection part according to an embodiment of the present disclosure.
FIG. 8 is a plan view of a first insulation part and side wires according to an embodiment of the present disclosure.

In some embodiments, the first electrostatic protection part 51, the second electrostatic protection part 52, and the third electrostatic protection part 53 are connected as a single-piece structure. FIG. 6 is a plan view of a first electrostatic protection part and driving signal lines according to an embodiment of the present disclosure, and FIG. 7 is a plan view of a third electrostatic protection part according to an embodiment of the present disclosure. As shown in FIG. 7, an orthographic projection of the third electrostatic protection part 53 on the first face 1*a* traverses the first face 1*a* in a first direction; and as shown in FIG. 6, an orthographic projection of the first electrostatic protection part 51 on the second face 1*b* traverses the second face 1*b* in the first direction. The first direction intersects with a direction from the display region AA to the peripheral region NA. For example, the first direction is perpendicular to the direction from the display region AA to the peripheral region NA. In this case, the electrostatic protection layer 5 can led out the static electricity no matter where the side wire 4 on which static electricity is generated is located, thereby preventing the static electricity from damaging a device and/or circuit inside the display panel, and improving the electrostatic protection capability of the display panel.

In some embodiments, as shown in FIG. 6, an orthographic projection of the first electrostatic protection part 51 on the base substrate 1 completely covers an orthographic projection of each second via hole 62 on the base substrate 1. In an embodiment, a closest distance d1 between an orthographic projection of a boundary of the first electrostatic protection part 51 away from the second electrostatic protection part 52 on the base substrate 1 and an orthographic projection of the second via hole 62 on the base substrate 1 is between 15 μm and 25 μm, so as to guarantee reliable connection between the first electrostatic protection part 51 and the second via hole 62. For example, d1 may be 15 μm or 18 μm or 20 μm or 22 μm or 25 μm.

In some embodiments, as shown in FIG. 3, the display panel further includes: a second insulation layer 7 on a side of the electrostatic protection layer 5 close to the side wires 4.

In an embodiment, the second insulation layer 7 includes: a first insulation part 71 and a second insulation part 72. The first insulation part 71 is located between the first electrostatic protection part 51 and the side wires 4, the second insulation part 72 is located between the second electrostatic protection part 52 and the side wires 4, and an orthographic projection of the first insulation part 71 on the base substrate 1 is not overlapped with the orthographic projection of each second via hole 62 on the base substrate 1. In other words, a boundary of the first insulation part 71 does not extend to the second via hole 62, and does not affect the connection between the second via holes 62 and the first electrostatic protection part 51.

FIG. 8 is a plan view of a first insulation part and side wires according to an embodiment of the present disclosure. In some embodiments, as shown in FIGS. 3 and 8, the first insulation part 71 has a first side edge 71*a* away from the second insulation part 72 and extending in the first direction. The first direction intersects with the direction from the display region AA to the peripheral region NA. A part of each side wire 4 on the second face 1*b* has a first end 4*a* close to the first side edge, and a distance d2 between an orthographic projection of the first side edge 71*a* on the base substrate 1 and an orthographic projection of the first end 4*a* on the base substrate 1 is between 15 μm and 25 μm, so as to ensure that the first insulation part 71 completely covers the part of each side wire 4 on the second face 1*b*, without affecting connection of the first electrostatic protection part 51 to the ground lines 3*a* through the second via holes 62. For example, d2 may be 15 μm or 18 μm or 20 μm or 22 μm or 25 μm.

In some embodiments, as shown in FIG. 3, the second insulation layer 7 further includes a third insulation part 73 connected to the second insulation part 72. The third insulation part 73 is disposed on a side, away from the base substrate, of a part of each side wire 4 on the first face 1*a* of the base substrate 1, and an orthographic projection of the third insulation part 73 on the base substrate 1 covers an orthographic projection on the base substrate 1 of the part of each side wire 4 on the first face 1*a* of the base substrate 1.

The third insulation part 73 has a second side edge away from the second insulation part 72 and extending in the first direction. The part of each side wire 4 on the first face 1*a* has a second end close to the second side edge, and a distance d3 between an orthographic projection of the second side edge on the base substrate 1 and an orthographic projection of the second end on the base substrate 1 is between 15 μm and 25 μm.

The second insulation part 72, the first insulation part 71, and the third insulation part 73 may be formed as a single-piece structure and completely cover all side wires 4.

Figure 9:
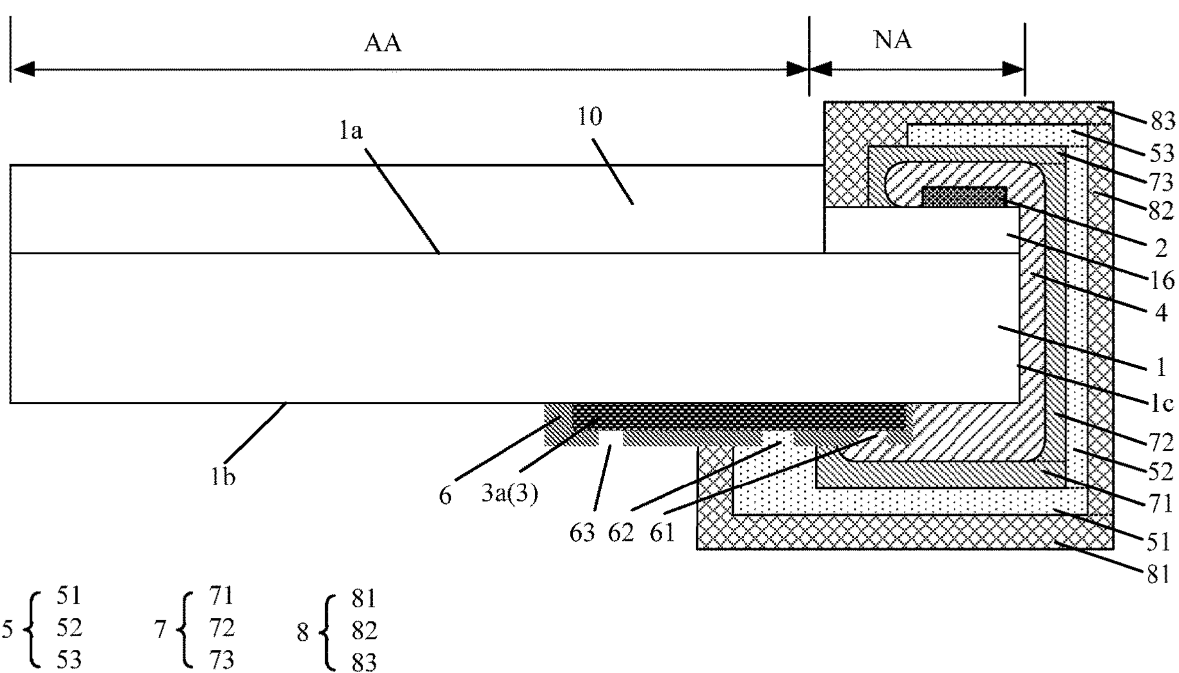
FIG. 9 is a schematic structural diagram of another display panel according to an embodiment of the present disclosure.

FIG. 9 is a schematic structural diagram of another display panel according to an embodiment of the present disclosure. As shown in FIG. 9, in some embodiments, the display panel further includes: a third insulation layer 8, and at least a part of the third insulation layer 8 is located on a side of the second electrostatic protection part 52 away from the side face 1*c* of the base substrate 1.

An orthographic projection of the third insulation layer 8 on the side face 1*c* of the base substrate covers the orthographic projection of the second electrostatic protection part 52 on the side face 1*c*. In this manner, the third insulation layer 8 can at least protect the second electrostatic protection part 52, and when a plurality of display panels are spliced to form a large-size display screen, the third insulation layer 8 can prevent static electricity generated on a display panel from influencing adjacent display panels.

In an exemplary embodiment, as shown in FIG. 9, the third insulation layer 8 may specifically include a fourth insulation part 81, a fifth insulation part 82, and a sixth insulation part 83. The fourth insulation part 81 is located on a side of the first electrostatic protection part 51 away from the base substrate, the fifth insulation part 82 is located on a side of the second electrostatic protection part 52 away from the side face of the base substrate 1, and the sixth insulation part 83 is located on a side of the third electrostatic protection part 53 away from the base substrate 1. In an exemplary embodiment, an orthographic projection of the fourth insulation part 81 on the second face 1*b* covers an orthographic projection of the first electrostatic protection part 51 on the second face 1*b*, an orthographic projection of the fifth insulation part 82 on the side face 1*c* covers an orthographic projection of the second electrostatic protection part 52 on the side face 1*c*, and an orthographic projection of the sixth insulation part 83 on the base substrate 1 covers an orthographic projection of the third insulation part 73 on the base substrate 1 and an orthographic projection of the third electrostatic protection part 53 on the base substrate 1.

Figure 10:
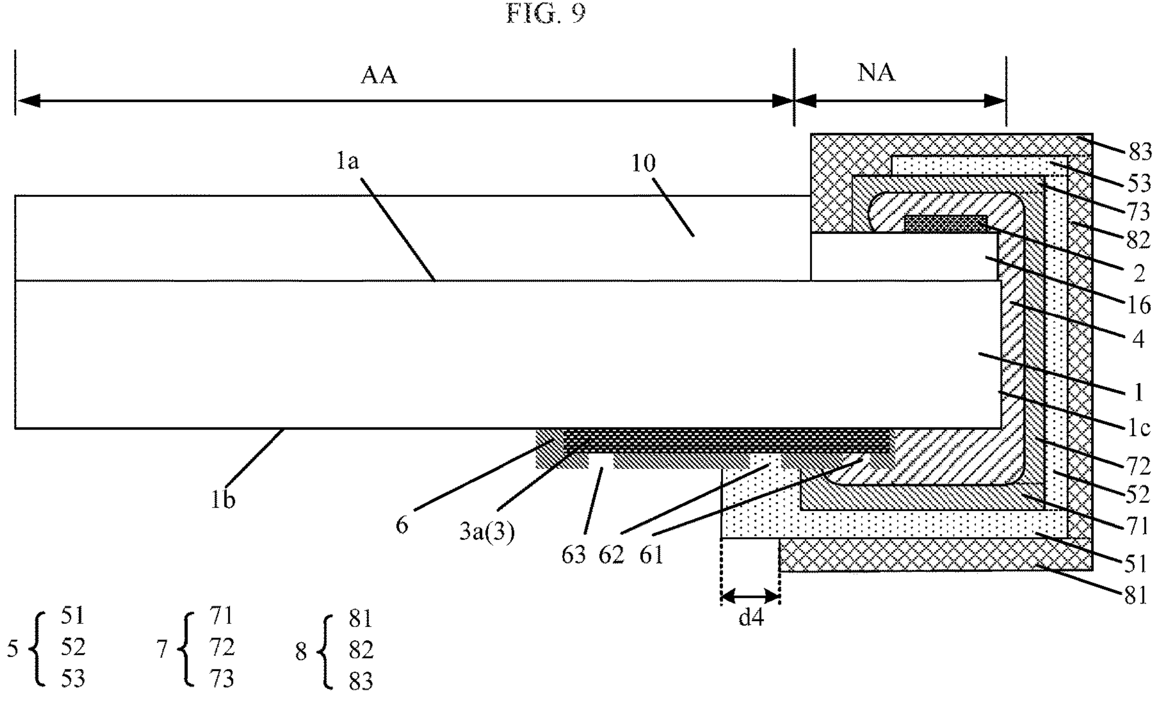
FIG. 10 is a schematic structural diagram of another display panel according to an embodiment of the present disclosure.

FIG. 10 is a schematic structural diagram of another display panel according to an embodiment of the present disclosure. As shown in FIG. 10, the fourth insulation part 81 in the third insulation layer 8 is located on a side of the first electrostatic protection part 51 away from the second face of the base substrate, and an orthographic projection of the first electrostatic protection part 51 on the second face 1*b* goes beyond an orthographic projection of the fourth insulation part 81 on the second face 1*b*. For example, a part of the first electrostatic protection part 51 away from the edge of the display panel is exposed from the fourth insulation part 81, and the exposed part of the first electrostatic protection part 51 from the fourth insulation part 81 may have a width d4, which may be between 0.5 mm and 1.5 mm, for example, 0.5 mm or 1 mm or 1.5 mm, in a second direction. Other structures of the display panel are the same as those shown in FIG. 9, and are not repeated here. The second direction is the direction from the display region AA to the peripheral region NA.

In addition, the second insulation layer 7 and the third insulation layer 8 in the embodiments of the present disclosure may be made of an inorganic material, such as silicon nitride, silicon oxide, or silicon oxynitride, or an epoxy resin material, which is not limited in the present disclosure.

Figure 11:
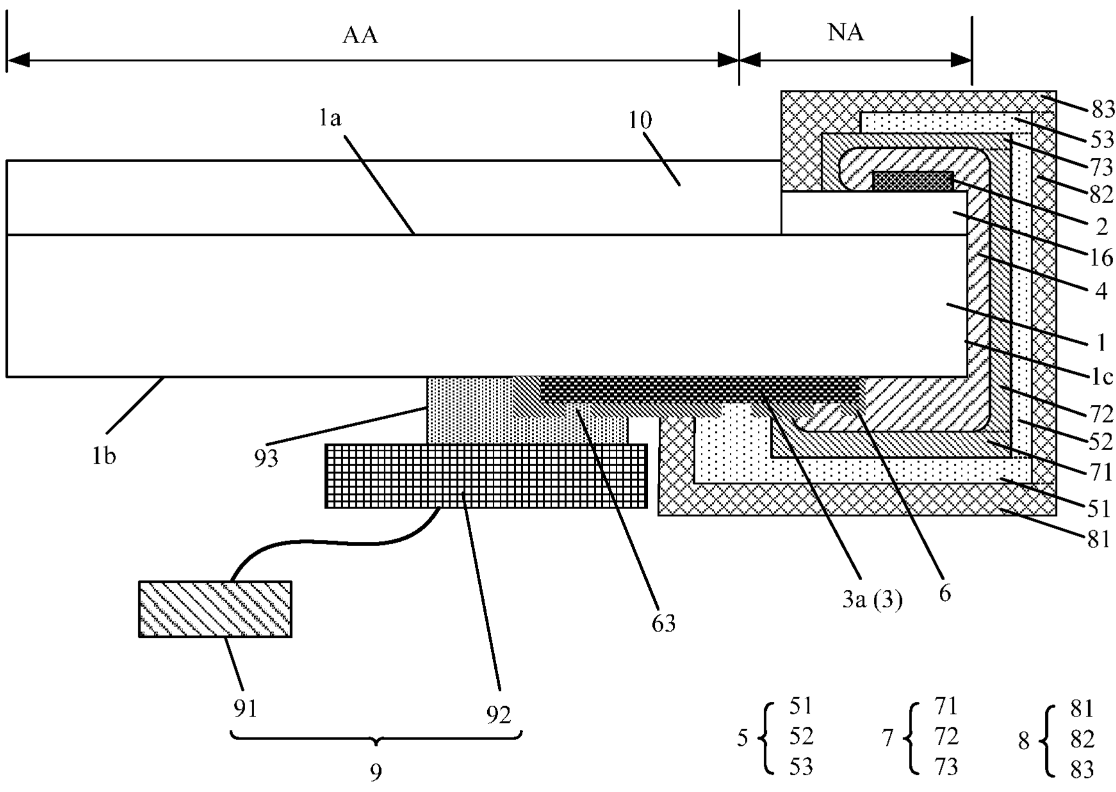
FIG. 11 is a schematic structural diagram of another display panel according to an embodiment of the present disclosure.

FIG. 11 is a schematic structural diagram of another display panel according to an embodiment of the present disclosure. In some embodiments, the display panel further includes a driving structure 9 connected to the plurality of driving signal lines 3 and configured to provide driving signals for the plurality of driving signal lines 3. Here, other structures than the driving structure 9 on the display panel of FIG. 11 may be the same as those shown in FIG. 9.

As described above, the first insulation layer 6 is further provided with third via holes 63 (see FIGS. 5 and 11), and the driving structure 9 is connected to the driving signal lines 3 through the third via holes 63 in the first insulation layer 6. The first via hole 61 is located at a position close to an edge of the display panel, the third via hole 63 is located at a position close to a middle part of the display panel, and the second via hole 62 is located between the third via hole 63 and the first via hole 61. The driving structure 9 is connected to every driving signal line 3 through the third via holes 63.

Figure 12:
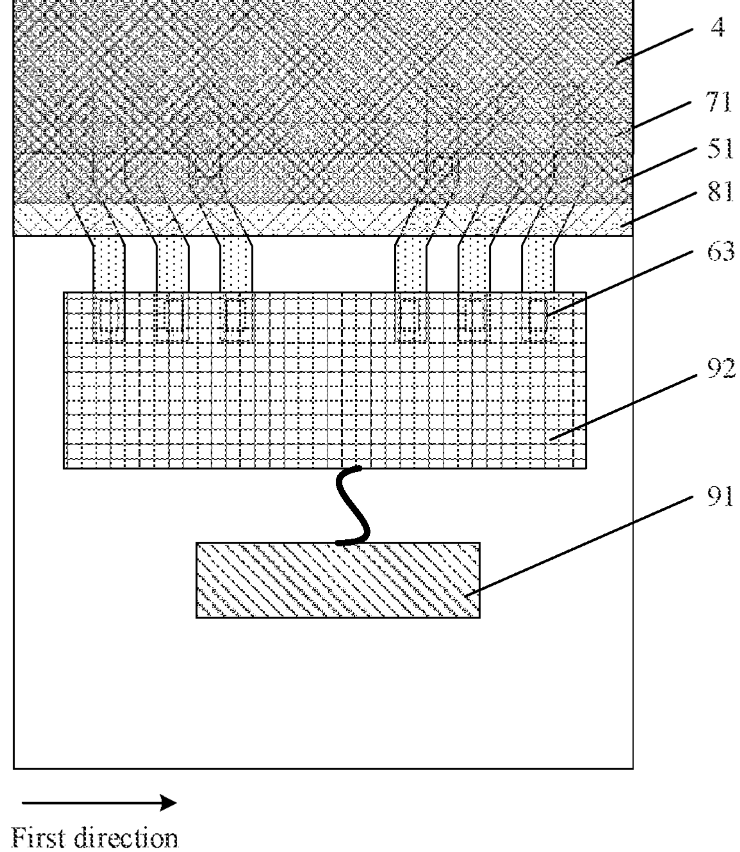
FIG. 12 is a rear view of a display panel according to an embodiment of the present disclosure.

FIG. 12 is a rear view of a display panel according to an embodiment of the present disclosure. As shown in FIGS. 11 and 12, the driving structure 9 may specifically include: a driving circuit board 91 and a flexible circuit board 92. The driving circuit board 91 is connected to the flexible circuit board 92, the flexible circuit board 92 is connected to the driving signal lines 3 through the third via holes 63, and the driving circuit board 91 provides driving signals to the driving signal lines 3 through the flexible circuit board 92.

In some embodiments, to connect the flexible circuit board 92 to the driving signal lines 3, a conductive adhesive 93 may be coated at positions of the third via holes 63, and then the flexible circuit board 92 is pressed onto the base substrate 1, so that bonding electrodes on the flexible circuit board 92 are connected to the driving signal lines 3 through the conductive adhesive 93 in the third via holes 63. In addition, the residual conductive adhesive 93 in the third via holes 63 can further play a role of fixing the flexible circuit board 92.

Figure 13:
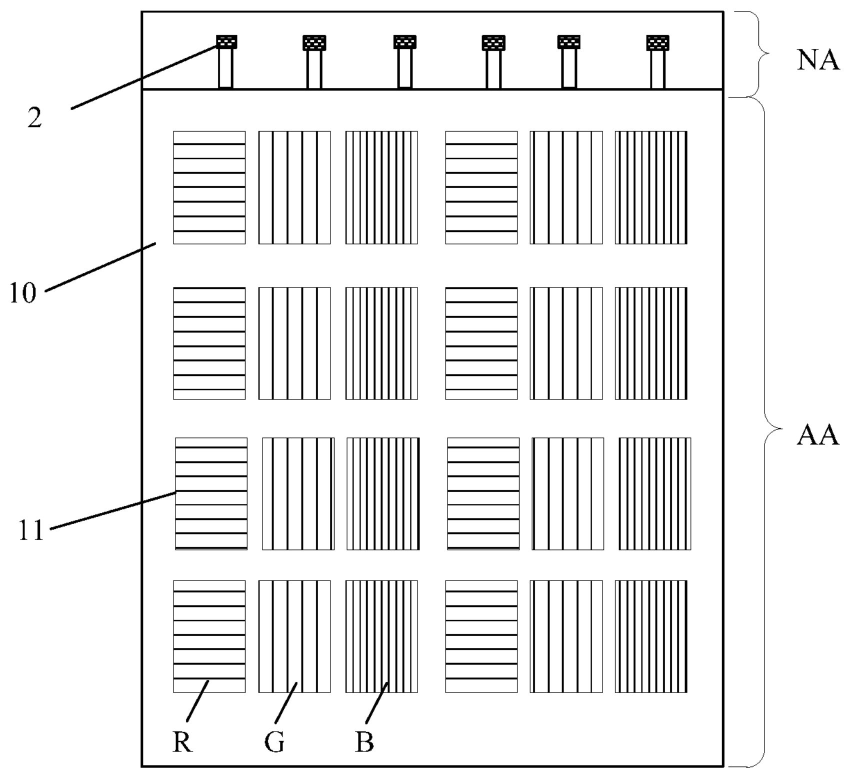
FIG. 13 is a schematic front view of a display structure layer according to an embodiment of the present disclosure.
Figure 14:
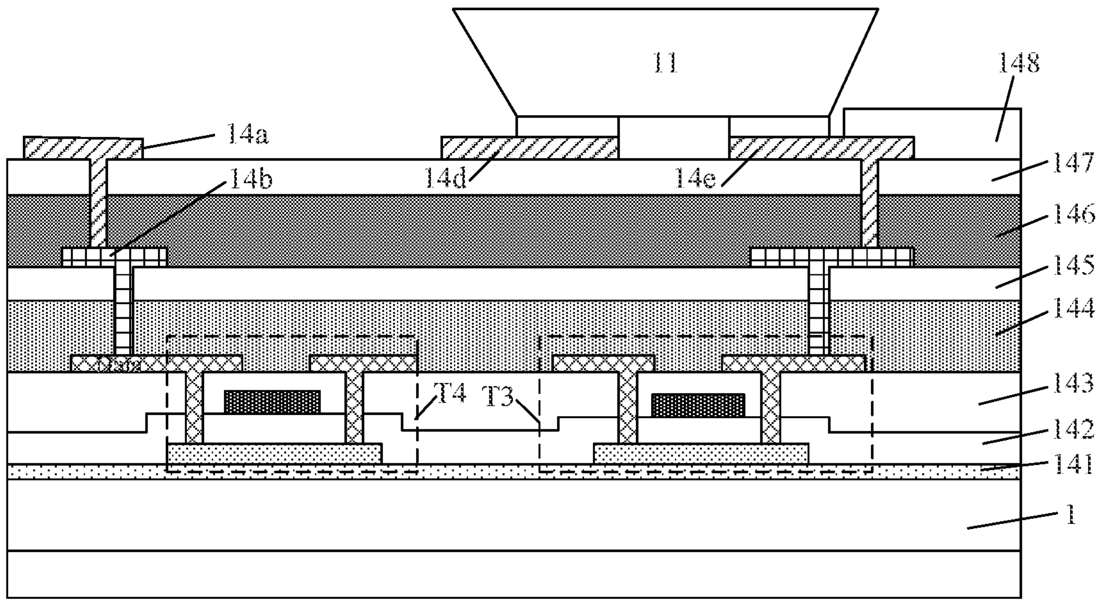
FIG. 14 is a schematic structural diagram of a display structure layer according to an embodiment of the present disclosure.

FIG. 13 is a schematic front view of a display structure layer according to an embodiment of the present disclosure, and FIG. 14 is a schematic structural diagram of a display structure layer according to an embodiment of the present disclosure. As shown in FIGS. 13 and 14, the display structure layer includes a light-emitting element 11 in each sub-pixel, and further includes a pixel circuit connected to the light-emitting element 11. The light-emitting element 11 may be a micro light-emitting diode that emits blue, red or green light. In an exemplary embodiment, a plurality of light-emitting elements 11 may form a plurality of repetitive units, and each repetitive unit includes a red light-emitting element R, a green light-emitting element G, and a blue light-emitting element B.

Figure 15:
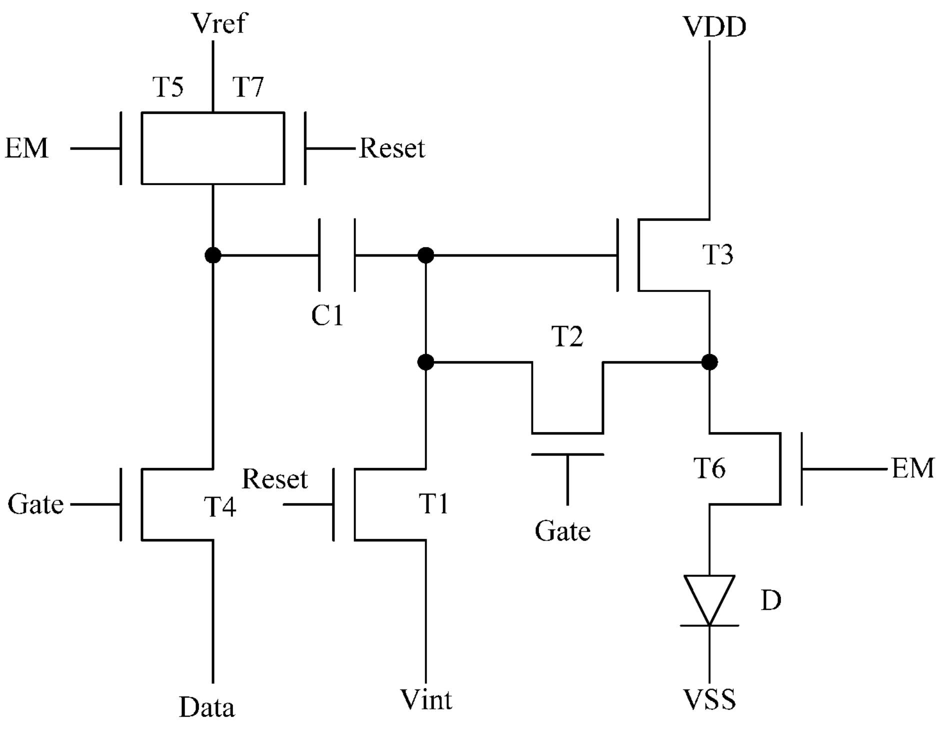
FIG. 15 is a schematic diagram of a pixel circuit according to an embodiment of the present disclosure.

FIG. 15 is a schematic diagram of a pixel circuit according to an embodiment of the present disclosure. As shown in FIG. 15, the pixel circuit may specifically include: a first reset transistor T1, a threshold compensation transistor T2, a driving transistor T3, a switch transistor T4, a first light-emitting control transistor T5, a second light-emitting control transistor T6, a second reset transistor T7, and a first storage capacitor C1. A first electrode of the first reset transistor T1 is coupled to an initial voltage signal terminal Vint, a second electrode of the first reset transistor T1 is coupled to a second end of the first storage capacitor C1, a first electrode of the threshold compensation transistor T2, and a control electrode of the driving transistor T3, and a control electrode of the first reset transistor T1 is coupled to a reset signal terminal Reset. A second electrode of the threshold compensation transistor T2 is coupled to a second electrode of the driving transistor T3 and a first electrode of the second light-emitting control transistor T6, and a control electrode of the threshold compensation transistor T2 is coupled to a gate line Gate. A first electrode of the driving transistor T3 is coupled to a first power supply voltage terminal VDD. A first electrode of the switch transistor T4 is coupled to a data line Data, a second electrode of the switch transistor T4 is coupled to a second electrode of the first light-emitting control transistor T5, a second electrode of the second reset transistor T7, and a first end of the first storage capacitor C1, and a control electrode of the switch transistor T4 is coupled to the gate line. A first electrode of the first light-emitting control transistor T5 is coupled to a reference voltage signal terminal Vref, and a control electrode of the first light-emitting control transistor T5 is coupled to a light-emitting control line EM. A second electrode of the second light-emitting control transistor T6 is coupled to a first electrode of the light-emitting element 11, and a control electrode of the second light-emitting control transistor T6 is coupled to the light-emitting control line EM. A first electrode of the second reset transistor T7 is coupled to the reference voltage signal terminal Vref, a control electrode of the second reset transistor T7 is coupled to the reset signal terminal Reset, and a second electrode of the light-emitting element 11 is coupled to a second power supply voltage terminal VSS.

Thereinafter, positional relationship of film layers in the display structure layer of FIG. 14 will be described, and it should be understood that FIG. 14 illustrates merely some of the devices, such as the switch transistor T4, the driving transistor T3, and the like. Here, description is given by taking the switch transistor T4 and the driving transistor T3 being top gate thin film transistors as an example.

The display structure layer 10 includes: a buffer layer 141 on the base substrate 1; an active layer of the switch transistor T4 and an active layer of the driving transistor T3 that are in a same layer and on the buffer layer 141; a gate insulation layer 142 on the layer where the active layer of the switch transistor T4 and the active layer of the driving transistor T3 are located, where the gate insulation layer 142 may cover the display region AA and the peripheral region NA; a gate of the switch transistor T4 and a gate of the driving transistor T3 in a same layer and on the gate insulation layer 142; a fourth insulation layer 143 on the layer where the gate of the switch transistor T4 and the gate of the driving transistor T3 are located, where the fourth insulation layer 143 may cover the display region AA and the peripheral region NA; a source and a drain of the switch transistor T4, a source and a drain of the driving transistor T3, and a data line connected to the source of the switch transistor T4, which are all located in a same layer and on the fourth insulation layer 143; a first planarization layer 144 on the layer where the source and the drain of the switch transistor T4, the source and the drain of the driving transistor T3, and the data line connected to the source of the switch transistor T4 are located, the first planarization layer 144 being located in the display region AA only; a first passivation layer 145 on the first planarization layer 144, the first passivation layer 145 covering the display region AA and the peripheral region NA; a second sub-signal incoming line 14*b* and a first connection electrode 14*c* in a same layer and on the first passivation layer 145, the second sub-signal incoming line 14*b* being connected to the data line through a fourth via hole penetrating the first planarization layer 144 and the first passivation layer 145, and the first connection electrode 14*c* being connected to the drain of the driving transistor T3 through a fourth via hole penetrating the first planarization layer 144 and the first passivation layer 145; a second planarization layer 146 on the layer where the second sub-signal incoming line 14*b* and the first connection electrode 14*c* are located, the second planarization layer 146 being located in the display region AA only; a second passivation layer 147 on the second planarization layer 146, where the second passivation layer 147 may cover the display region AA and the peripheral region NA; a first sub-signal incoming line 14*a*, a first pad 14*d*, and a second pad 14*e*, which are all in a same layer and on the second passivation layer 147, where the first sub-signal incoming line 14*a* extends from the display region AA to the peripheral region NA, and is connected to the second sub-signal incoming line 14*b* through a fifth via hole penetrating the second planarization layer 146 and the second passivation layer 147, and the first pad 14*d* is connected to the first connection electrode 14*c* through a fifth via hole penetrating the second planarization layer 146 and the second passivation layer 147; a third passivation layer 148 on the first sub-signal incoming line 14*a*, the first pad 14*d*, and the second pad 14*e*, where the third passivation layer 148 may cover the display region AA and the peripheral region NA; and a first bonding electrode 2 in the peripheral region NA and on the third passivation layer 148, the first bonding electrode 2 being connected to the first sub-signal incoming line 14*a* through a sixth via hole penetrating the third passivation layer 148. A first electrode of each light-emitting element 11 is connected to the first pad 14*d* through a seventh via hole penetrating the third passivation layer 148, and a second electrode of the light-emitting element 11 is connected to the second pad 14*e* through an eighth via hole penetrating the third passivation layer 148.

It should be noted that the pixel structure described above is merely for purpose, and in other exemplary embodiments, the pixel structure may have other structures.

Figure 16:
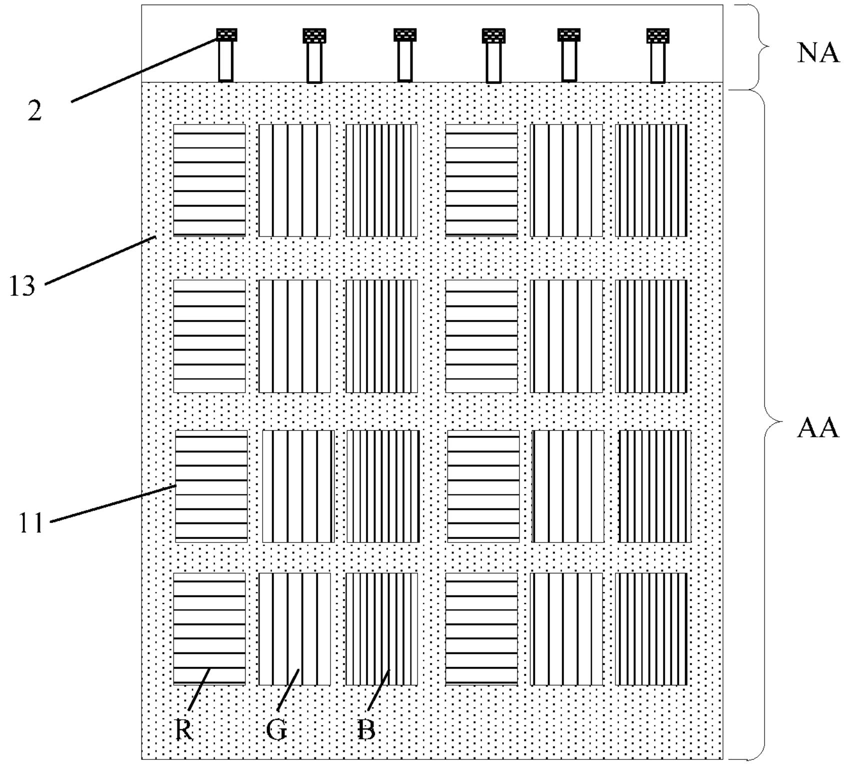
FIG. 16 is a plan view of a packaging layer according to an embodiment of the present disclosure.

FIG. 16 is a plan view of a packaging layer according to an embodiment of the present disclosure. In some embodiments, as shown in FIG. 16, the display panel may further include a packaging layer 13 on a side of the plurality of light-emitting elements 11 away from the base substrate 1. The packaging layer 13 may include: a plurality of light-transmitting parts, and a light-shielding part separating the plurality of light-transmitting parts from each other. The light-transmitting parts are provided in one-to-one correspondence with the light-emitting elements 11 and are configured to allow light emitted from the light-emitting elements 11 to pass therethrough. The light-shielding part may be made of a black insulating material, for example, an inorganic material such as silicon nitride, silicon oxide, or silicon oxynitride, or a resin material such as epoxy resin. The light-transmitting part may be a hollow structure, or may be a film layer made of a transparent material.

When the light-emitting element 11 is a micro light-emitting diode, the light-emitting direction is not collimated, and light is emitted in different directions. Therefore, part of the light is emitted towards the base substrate 1. By providing the light-shielding part, reflection of light by metal structures of the light-emitting elements 11 and the base substrate 1 can be avoided. In addition, by providing the light-shielding part, light crosstalk between adjacent light-emitting elements 11 can be avoided.

Figure 17:
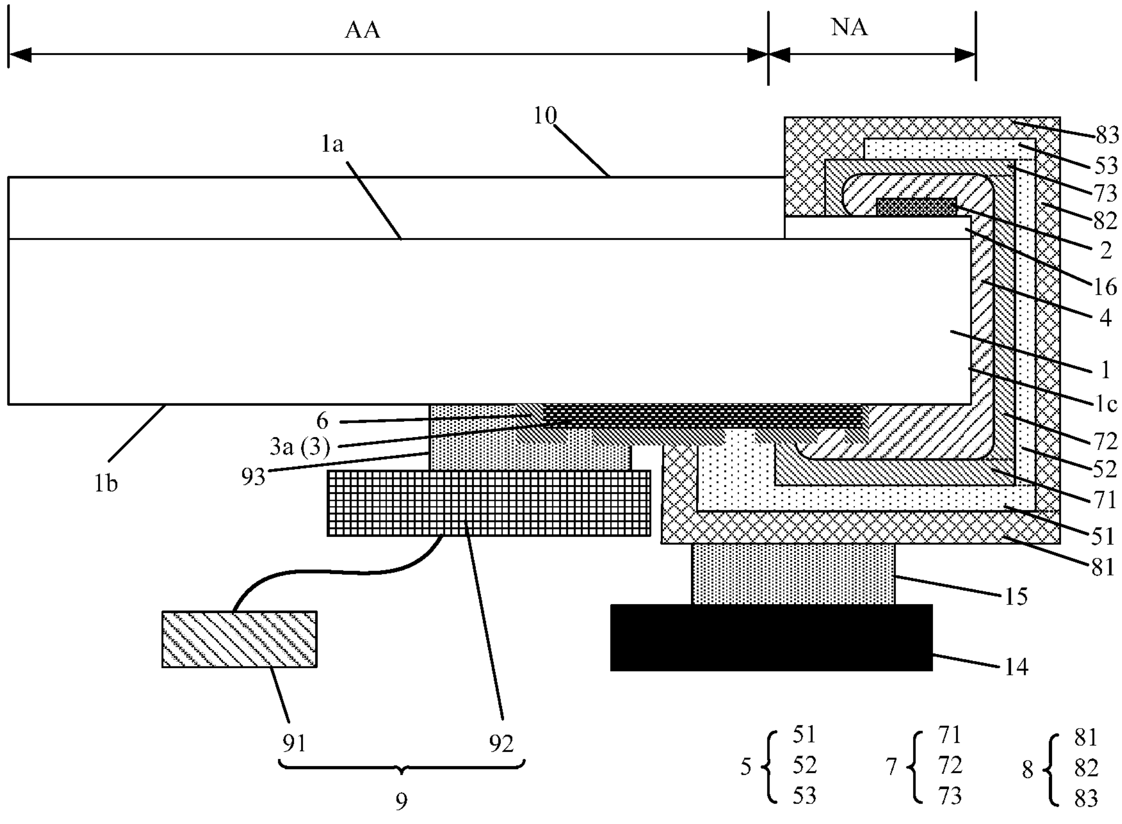
FIG. 17 is a schematic structural diagram of a display apparatus according to an embodiment of the present disclosure.
Figure 18:
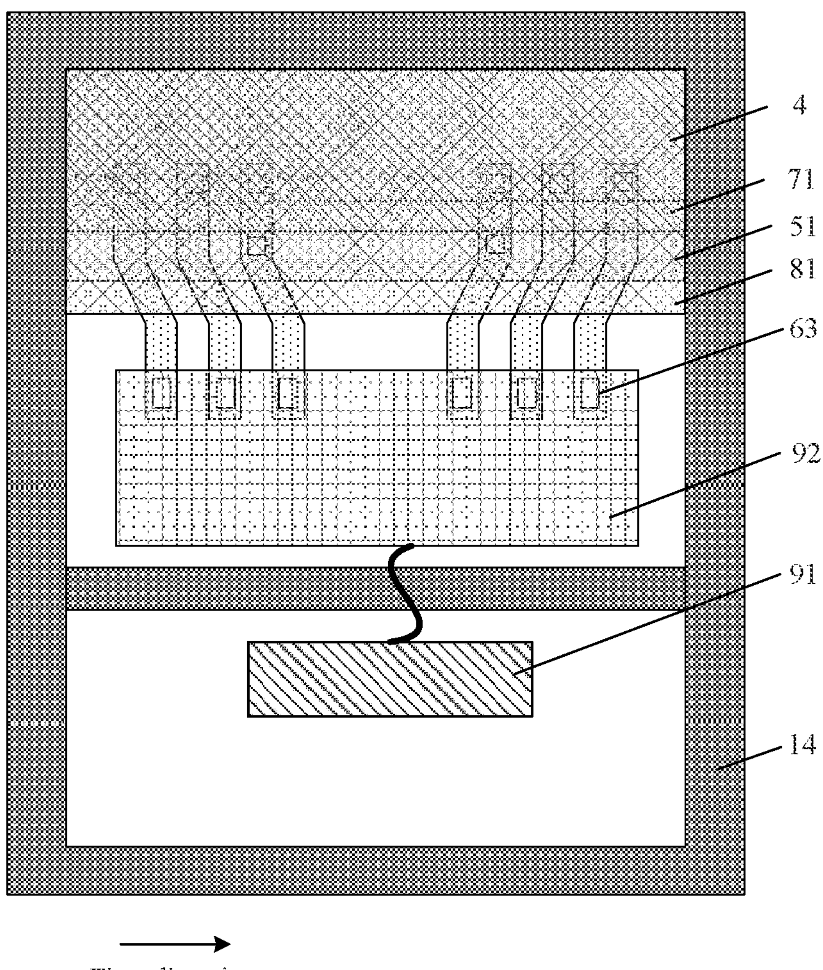
FIG. 18 is a plan view of an outer frame according to an embodiment of the present disclosure.

FIG. 17 is a schematic structural diagram of a display apparatus according to an embodiment of the present disclosure, and FIG. 18 is a plan view of an outer frame according to an embodiment of the present disclosure. As shown in FIGS. 17 and 18, a display apparatus according to an embodiment of the present disclosure includes: the display panel as described above, and an outer frame 14, and at least a part of the outer frame 14 is located on a side of the base substrate 1 away from the display signal line 16. The display apparatus further includes a bonding adhesive 15 on the side of the base substrate 1 away from the display signal line 16, and provided between the display panel and the outer frame 14.

In a splicing display apparatus, the outer frame 14 is fixedly connected to a body of the splicing display apparatus to fix the display panel.

In an exemplary embodiment, the display apparatus of FIG. 17 includes a display panel having a structure as that shown in FIG. 9, where the fourth insulation part 81 completely covers the first electrostatic protection part 51, and in this case the bonding adhesive is used for fixing the outer frame 14 only.

Figure 19:
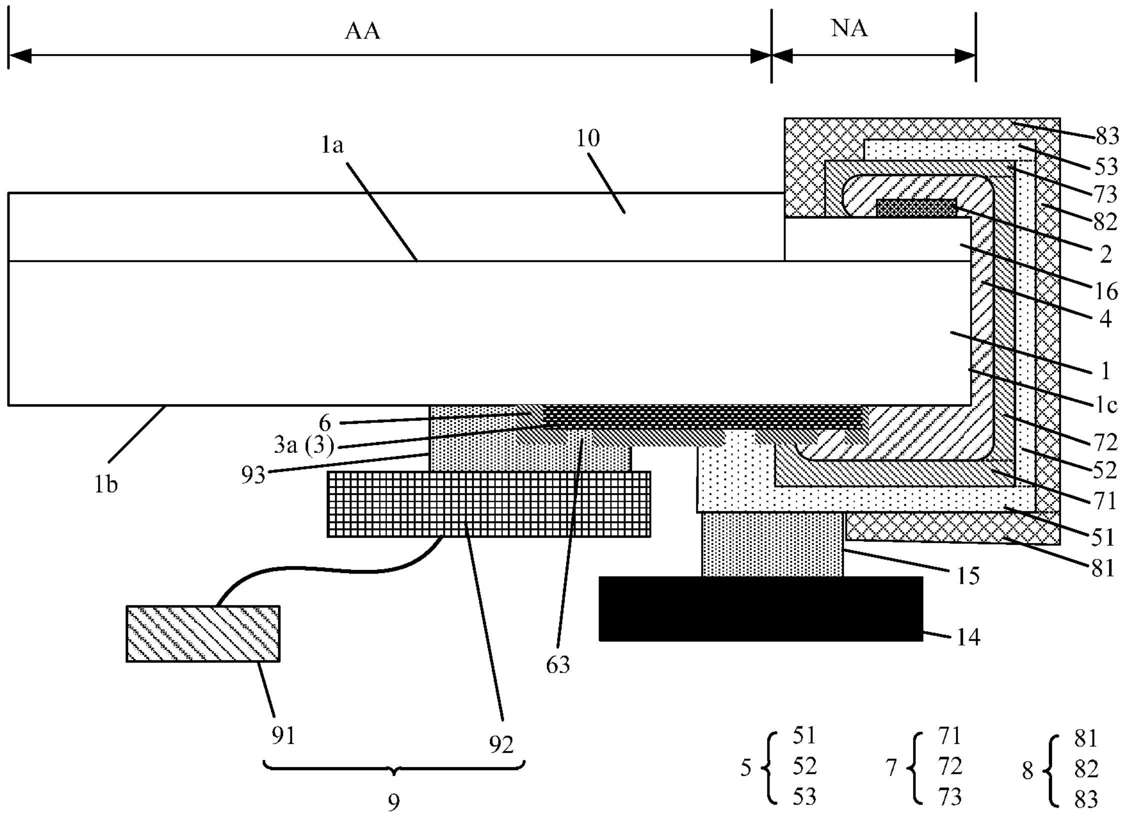
FIG. 19 is a schematic structural diagram of another display apparatus according to an embodiment of the present disclosure.

FIG. 19 is a schematic structural diagram of another display apparatus according to an embodiment of the present disclosure. As shown in FIG. 19, the display apparatus includes a display panel having a structure as that shown in FIG. 10, where the fourth insulation part 81 does not completely cover the first electrostatic protection part 51. In this case, the bonding adhesive may be a conductive adhesive, and the outer frame may be a metal outer frame (for example, an aluminum frame with good heat dissipation and light weight). Therefore, the first electrostatic protection part 51 can be connected to the metal outer frame 14 through the conductive adhesive 15, and static electricity on the first electrostatic protection part 51 can be led out through the metal frame, so that static electricity can be more sufficiently discharged, and the display effect of the display panel is prevented from being affected.

It should be noted that the display apparatus may be any product or component having a display function, such as an electronic paper, a mobile phone, a tablet PC, a television, a monitor, a notebook computer, a digital photo frame, a GPS or the like.

It will be appreciated that the above implementations are merely exemplary implementations for the purpose of illustrating the principle of the present disclosure, and the present disclosure is not limited thereto. It will be apparent to one of ordinary skill in the art that various modifications and variations can be made without departing from the spirit or essence of the present disclosure. Such modifications and variations should also be considered as falling into the protection scope of the present disclosure.

What is claimed is:

1. A display panel, comprising:

a base substrate, wherein the base substrate has a first face and a second face opposite to each other, and a side face connecting the first face and the second face; the first face comprises a display region and a peripheral region;

a plurality of first bonding electrodes in the peripheral region, wherein each of the plurality of first bonding electrodes is electrically connected to a display signal line on the first face;

a plurality of driving signal lines on the second face of the base substrate, wherein at least one of the plurality of driving signal lines is a ground line;

a plurality of side wires, wherein each of the plurality of side wires electrically connects one of the plurality of driving signal lines to one of the plurality of first bonding electrodes via the side face; and an electrostatic protection layer electrically connected to the ground line, wherein an orthographic projection of the electrostatic protection layer on the side face is at least partially overlapped with orthographic projections of the plurality of side wires on the side face, wherein the electrostatic protection layer comprises at least:

a first electrostatic protection part and a second electrostatic protection part connected to each other, the first electrostatic protection part is located on the second face of the base substrate, and an orthographic projection of the first electrostatic protection part on the second face covers an orthographic projection on the second face of a part of each side wire on the second face; the first electrostatic protection part is connected to the ground line; and an orthographic projection of the second electrostatic protection part on the side face covers an orthographic projection of each side wire on the side face, wherein the display panel further comprises:

a first insulation layer on a side of the plurality of driving signal lines away from the base substrate, wherein each side wire is connected to one of the plurality of driving signal lines through a first via hole in the first insulation layer; and the first electrostatic protection part is located on a side of the first insulation layer away from the base substrate, and is connected to the ground line through a second via hole in the first insulation layer, wherein the display panel further comprises:

a second insulation layer on a side of the electrostatic protection layer close to the plurality of side wires;

wherein the second insulation layer comprises: a first insulation part and a second insulation part, the first insulation part is between the first electrostatic protection part and the plurality of side wires, the second insulation part is between the second electrostatic protection part and the plurality of side wires, and an orthographic projection of the first insulation part on the base substrate is not overlapped with an orthographic projection of the second via hole on the base substrate.

2. The display panel according to claim 1, wherein a distance between an orthographic projection of a boundary of the first electrostatic protection part away from the second electrostatic protection part on the base substrate and an orthographic projection of the second via hole on the base substrate is between 15 μm and 25 μm.

3. The display panels according to claim 1, wherein the first insulation part has a first side edge, the first side edge is on a side of the first insulation part away from the second insulation part and extends in a first direction, wherein the first direction is parallel to an extending direction of a border between the display region and the peripheral region; and the part of each side wire on the second face has a first end, the first end is on a side of the part of each side wire on the second face close to the first side edge, and a distance between an orthographic projection of the first side edge on the base substrate and an orthographic projection of the first end on the base substrate is between 15 μm and 25 μm.

4. The display panels according to claim 1, wherein the second insulation layer further comprises:

a third insulation part on a side of the part of each side wire on the second face away from the second face, and connected to the second insulation part;

the third insulation part has a second side edge away from the side face of the base substrate and extending in a first direction, wherein the first direction is parallel to an extending direction of a border between the display region and the peripheral region; and a part of each side wire on the first face has a second end, and the second end is on a side of part of each side wire on the first face close to the second side edge, and a distance between the second side edge and the second end is between 15 μm and 25 μm.

5. The display panel according to claim 1, wherein the electrostatic protection layer further comprises:

a third electrostatic protection part on the first face of the base substrate, in the peripheral region, and connected to the second electrostatic protection part.

6. The display panel according to claim 1, further comprising:

a third insulation layer at least partially on a side of the second electrostatic protection part away from the side face of the base substrate.

7. The display panel according to claim 1, wherein the display region comprises a plurality of sub-pixels, each of which is provided with a light-emitting element connected to the display signal line.

8. The display panel according to claim 1, further comprising:

a driving structure connected to the plurality of driving signal lines and configured to provide driving signals to the plurality of driving signal lines.

9. A display apparatus, comprising:

the display panel according to claim 1;

an outer frame at least partially on a side of the base substrate away from the display signal line; and a bonding adhesive on the side of the base substrate away from the display signal line and between the display panel and the outer frame.

10. The display panel according to claim 5, wherein the first electrostatic protection part, the second electrostatic protection part, and the third electrostatic protection part are connected into a single-piece structure, an orthographic projection of the third electrostatic protection part on the first face traverses the first face in a first direction, and an orthographic projection of the first electrostatic protection part on the second face traverses the second face in the first direction, wherein the first direction is parallel to an extending direction of a border between the display region and the peripheral region.

11. The display panels according to claim 6, wherein the third insulation layer covers the entire second electrostatic protection part and at least a part of the first electrostatic protection part.

12. The display panels according to claim 8, further comprising:

a first insulation layer on a side of the plurality of driving signal lines away from the base substrate, wherein each side wire is connected to a corresponding driving signal line through a first via hole in the first insulation layer; and wherein the driving structure is connected to the plurality of driving signal lines through third via holes in the first insulation layer.

13. The display apparatus according to claim 9, wherein the outer frame is a metal frame; and the bonding adhesive is a conductive adhesive between the metal frame and the electrostatic protection layer.

* * * * *